United States Patent [19]
Naehring

[11] Patent Number: 5,205,532
[45] Date of Patent: Apr. 27, 1993

[54] PIVOTING AIR LOCK FOR A TREATMENT CHAMBER

[75] Inventor: Herbert Naehring, Rodenbach, Fed. Rep. of Germany

[73] Assignee: Leybold Aktiengesellschaft, Hanau, Fed. Rep. of Germany

[21] Appl. No.: 892,288

[22] Filed: Jun. 2, 1992

[30] Foreign Application Priority Data

Feb. 7, 1992 [DE] Fed. Rep. of Germany ....... 4203473

[51] Int. Cl.⁵ .............................................. F16K 25/00
[52] U.S. Cl. ........................................ 251/85; 251/298
[58] Field of Search ..................... 251/84, 85, 298

[56] References Cited

U.S. PATENT DOCUMENTS

| | | | |
|---|---|---|---|
| 1,656,185 | 1/1928 | Enz | 251/298 X |
| 2,247,773 | 7/1941 | Dunn | 251/85 X |
| 2,522,732 | 9/1950 | Whitworth | 251/84 |
| 2,767,738 | 10/1956 | Pottmeyer | 251/85 X |
| 2,939,616 | 6/1960 | Whittum et al. | 251/85 X |
| 3,727,880 | 4/1973 | Stock | 251/85 |
| 3,972,504 | 8/1976 | DiSabatino, Jr. et al. | 251/298 X |

FOREIGN PATENT DOCUMENTS

| | | | |
|---|---|---|---|
| 390165 | 9/1908 | France | 251/85 |
| 1570066 | 6/1980 | United Kingdom | |

Primary Examiner—John Rivell
Attorney, Agent, or Firm—Felfe & Lynch

[57] ABSTRACT

In a pivoting air lock for the entry and/or exit of a substrate from one treatment chamber into an adjacent one or from atmospheric space into a chamber of lesser pressure, especially a slot air lock for a pass-through vacuum coating apparatus, with a flap-like valve plate (2) held in stationary bearings (11, 11a) and two closing motors (10, 10a) in active connection with the valve plate, the valve plate (2) is, with the interposition of two spring rods (5, 5a), linked to a valve beam (1) which in turn has two diametrically opposite journals (12, 12a) which are coupled for rotation with the shafts (18, 18a) of the motors (10, 10a), the shafts (18, 18a) of the motors (10, 10a) being brought in a pressure-proof manner through the wall (13, 13a) of the chamber (3).

5 Claims, 2 Drawing Sheets

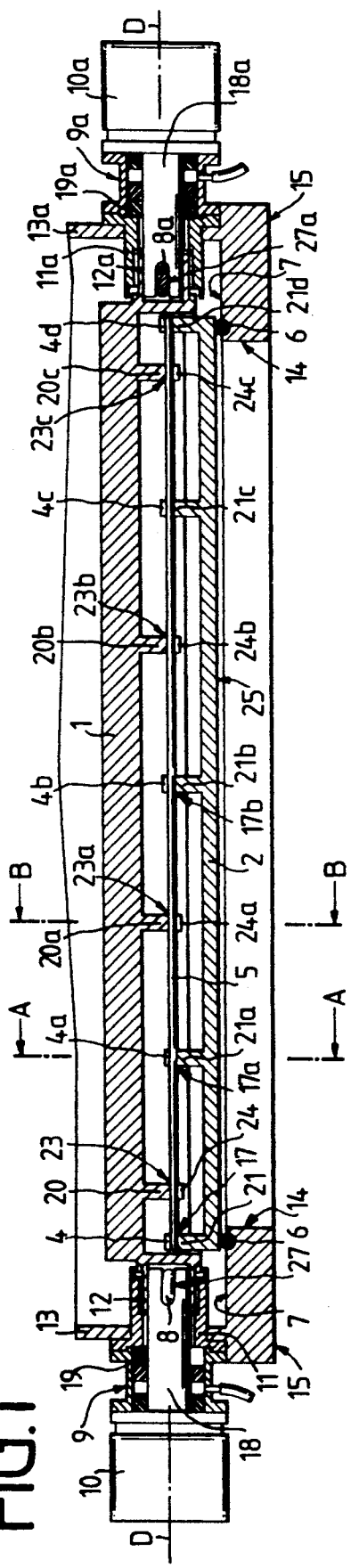
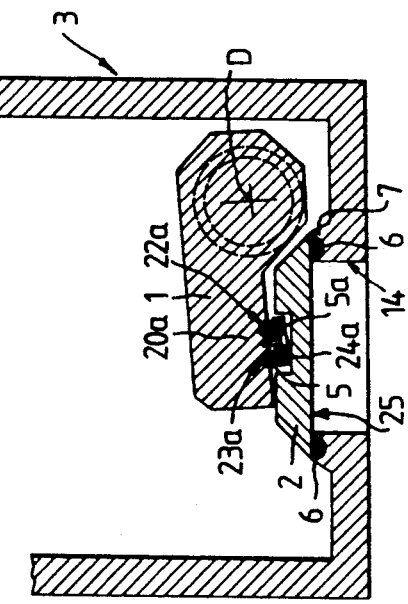
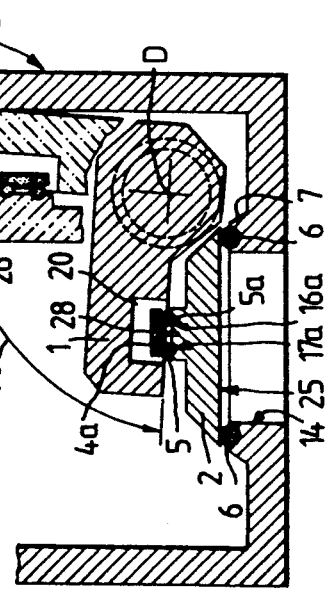

PIVOTING AIR LOCK FOR A TREATMENT CHAMBER

BACKGROUND OF THE INVENTION

The invention relates to a pivoting air lock for the entry and/or exit of a substrate from one treatment chamber into an adjacent one, or from atmospheric space into a chamber of lower pressure, especially a slot air lock for a pass-through vacuum coating apparatus, having a gate-like valve plate held in stationary bearings and a closing motor actively connected to the valve plate, and a frame-like sealing element surrounding the air lock opening.

DE-OS 39 41 502 has disclosed a loading and unloading chamber apparatus, having a low-pressure chamber, a transport mechanism provided within the low-pressure chamber in question for the transport of a substrate holder in plate form suitable for the releasable mounting of substrates, having an exhaust connection for exhausting the chamber to a low pressure, and with a gas inlet connection for the introduction of a gas in order to return the evacuated chamber to an atmospheric pressure.

In this known apparatus, an air lock valve is provided on both sides of the low-pressure chamber, and the valve plate has an elongated, parallelepipedal shape and is affixed to three bearing brackets through which a shaft is brought, which in turn is connected to levers which can be operated by a motor through a rack-and-pinion drive. The valve plate is held so as to be able to turn with respect to the levers fulcrumed on stationary bearings, so that the sealing surface of the valve plate can be pressed against the sealing surface on the housing of the low-pressure chamber, while the valve plate can be aligned to a certain extent with the plane of the housing sealing surface.

In practice, it has been found that the known valve system or known air lock valve fails to meet the most stringent sealing requirements because the necessary sealing ring is stressed unevenly since the sealing plate and drive shaft flex to a certain extent while in the closed state, but especially when the air lock plate has an extreme width-to-length ratio, and when the individual parts of the air lock valve are not very sturdy—and consequently heavy—and are not of extremely high quality material.

SUMMARY OF THE INVENTION

The present invention is addressed to the problem of designing a pivoting air lock of the kind in question such that a uniform closing or pressing force can be produced over the entire length of the valve plate, that the pressure stage and drive unit will be removable easily for repairs and maintenance (while the comparatively bulky and heavy valve unit remains completely mounted in the chamber, and lastly to the problem of designing the valve unit to be as stiff and at the same time as light as possible.

This problem is solved according to the invention by the fact that the valve plate is articulated on a valve beam running approximately parallel to it, the valve beam having two diametrically opposite journals which are coupled for rotation with the shafts of the drive motors otherwise provided outside of the chamber, and the shafts are brought in a pressure-resistant manner through the wall of the chamber.

BRIEF DESCRIPTION OF THE DRAWINGS

FIG. 1 is a longitudinal section through an air lock valve wherein the chamber for treating the substrate is represented only partially, FIG. 2 is a section along lines A—A transversely through the air lock valve of FIG. 1, FIG. 3 is a section along lines B—B transversely through the air lock valve of FIG. 1.

DETAILED DESCRIPTION OF THE PREFERRED EMBODIMENTS

Figure 4:
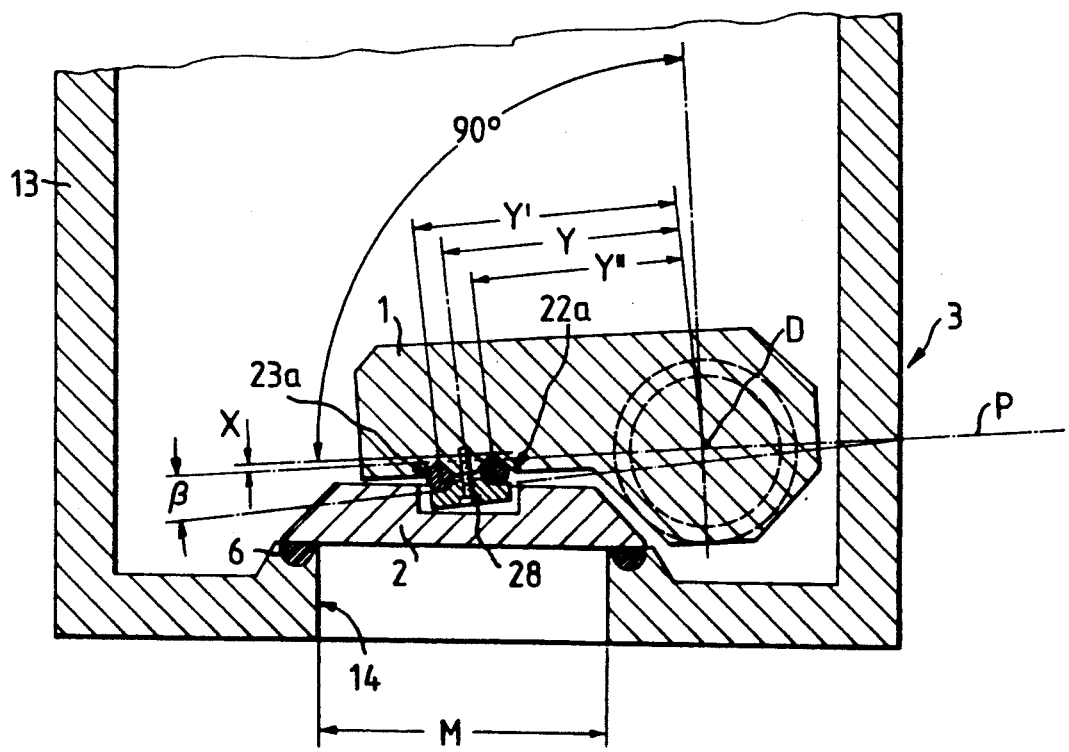
FIG. 4 is a view according to FIG. 3, but on a larger scale to better show details.

Instead of an air lock valve plate shaft, the subject of the invention is equipped with a flexurally stiff profile identified as the valve beam 1. Valve beam 1 is provided with two journals 12 and 12a which are accommodated in bearing cases 11 and 11a situated in the interior of the chamber 3 and in bearings therein.

The groove for the ring 6 that seals the air lock opening 14 is in the sealing plate 7. Since the thickness of the valve plate 2 is reduced, the result is an increase in the passage width or slot width M.

Fastening the valve plate 2 to the valve beam 1 by means of two elastic rods 5 and 5a constitutes a connection free of links and therefore free of friction which can shift toward one another on two axes, preventing the production of linkage friction and hence of particles produced by wear by movements of the valve plate 2 and valve beam 1 relative to one another.

The elastic rods 5 and 5a are disposed on the valve plate 2 and valve beam 1 such that they are pressed into corresponding first V-shaped grooves 22, 22a . . . 23, 23a . . . in first ribs 20, 20a . . . on the valve beam 1 by first clamps 24, 24a . . . fastened by screws 28, and in second V-shaped grooves 16, 16a . . . 17, 17a . . . on the valve plate 2 by second clamps 4, 4a, . . . These first and second V-grooves are configured such that, when the spring rods 5 and 5a are not biased, the valve plate 2 will assume a definite, nonparallel position (angle $\alpha$) with respect to the valve beam 1, so that, in the closing process, the valve plate sealing surface 25 will be placed onto the outside and the inside of O-ring 6 at the same moment in time. The nonparallel position mentioned is the result of the unequal depth (dimension X) of the grooves 22, 22a . . . 23, 23a . . . (see FIG. 4) with respect to the plane P of the valve beam.

As the closing continues after contact, the sealing plate 2 moves along rectilinearly, independently of the points at which the spring rods 5 and 5a are fastened to the valve beam, the rods performing a rotatory movement about the bearing axis D, until the pressing process (FIG. 3) ends.

Since the spring rod 5 that is farther away from the axis of rotation D describes a larger arc than the inside one, its flexure and hence its pressing force is less than that of the inner spring rod 5, the result being that the pressing of the sealing plate 2 against the outer O-ring portion 6 is likewise less than the it is at the inner one. This is corrected in that the spring rod fastening grooves 22, 22a, . . . are disposed by a particular amount X from the pivot plane P, so that the resultant of the pressing forces is applied again centrally, i.e., symmetrically with the O-ring portions 6. Another possibility for correcting the pressing forces results from the fact that the pairs of grooves in the first ribs 20, 20a, . . . , and second ribs 21, 21a, . . . , are not aligned with one another but vary slightly (e.g., 0.7 mm) in their distance Y from the axis of rotation D.

In order to have a very uniform pressing force over the entire length of the valve plate 2, the torque necessary for valve operation is applied symmetrically through both ends of the valve beam 1 by means of two air motors 10 and 10a. The extended shafts 18 and 18a of these motors extend through the pressure stages 9 and 9a into the chamber 3. Thus, the seals 19, 19a, etc. of the pressure stages 9 and 9a seal onto the drive shafts 18 and 18a, which are not subject to any flexural stress. Thus impairment of the sealing action by transverse shifting of the shaft axes cannot occur.

The shaft ends of the drive units are configured as forks 27, 27a, which during the assembly of the motors 10 and 10a straddle the cross keys 8, 8a, fixedly mounted in the journals (hollow journals) 12, 12a, of the valve beam 1. Since the cross keys 8, 8a, are perpendicular to the sealing surface D (not parallel thereto as shown for ease in understanding), when the valve beam 1 flexes no edge pressure on the fitting surfaces of the cross-spring drive shaft forks 27, 27a, and thus no additional stress on the drive shafts 18 and 18a.

Since the valve bearing housing and pressure stage housing are made separately, the pressure stage and drive unit can easily be replaced, while the actual heavy valve unit can remain completely assembled in the chamber 3.

Due to the bilateral, i.e., symmetrical, application of the torque to the actuator (the valve beam 1), as well as the valve plate 2 freely movable in two axes with respect to the valve beam 1, a largely uniform pressing of the sealing ring 6 on its entire circumference is achieved, which especially also compensates for any production inaccuracies.

I claim:

1. Air lock assembly for an opening in a wall of a treatment chamber, said air lock assembly comprising
a valve beam arranged for pivotable movement about an axis of rotation from an open position to a closed position, said valve beam having a plurality of spaced apart first ribs extending transversely of said axis of rotation, each rib having a pair of first grooves therein,
a valve plate extending parallel to said valve beam and pivotably connected thereto, said valve plate being arranged to close said opening when said valve beam is in the closed position, said valve plate having a plurality of spaced apart second ribs extending transversely of said axis of rotation, each rib having a pair of second grooves therein, and
two lengths of resilient material extending parallel to said axis of rotation, each length engaging a respective groove in each first rib and a respective groove in each second rib, said length being fixed to said first ribs by first clamps, said lengths being fixed to said second ribs by second clamps.

2. Pivoting air lock according to claim 1 wherein the pair of first grooves are formed at different depths from the plane of the valve beam (1), said valve plate having a planar closure surface at an acute angle with the plane of the valve beam when the valve beam is in the open position.

3. Pivoting air lock according to claim 1 wherein the first grooves are at different distances from the axis of rotation than the second grooves.

4. Air lock assembly as in claim 1 further comprising
a pair of closing motors situated outside said chamber, said motors each having a rotatable shaft passing sealingly through the wall of said chamber, said shafts having a common axis of rotation,
a pair of oppositely facing journals on said valve beam, said journals being fixed to respective said shafts.

5. Pivoting air lock according to claim 4 wherein the valve beam has journals provided with longitudinal bores into which the shafts of the motors enter, the shafts each having an end provided with a slot, a cross key brought through the journals and the slots transversely of the axis of rotation and coupling the motor shaft for rotation with the valve beam.

* * * * *